(12) United States Patent
Li et al.

(10) Patent No.: US 10,263,104 B2
(45) Date of Patent: Apr. 16, 2019

(54) FET TRANSISTOR ON A III-V MATERIAL STRUCTURE WITH SUBSTRATE TRANSFER

(71) Applicant: HRL Laboratories, LLC, Malibu, CA (US)

(72) Inventors: Zijian "Ray" Li, Oak Park, CA (US); Rongming Chu, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 118 days.

(21) Appl. No.: 14/261,622

(22) Filed: Apr. 25, 2014

(65) Prior Publication Data

US 2015/0311330 A1  Oct. 29, 2015

(51) Int. Cl.

| | |
|---|---|
| *H01L 29/778* | (2006.01) |
| *H01L 29/40* | (2006.01) |
| *H01L 29/423* | (2006.01) |
| *H01L 29/417* | (2006.01) |
| *H01L 29/66* | (2006.01) |
| *H01L 21/02* | (2006.01) |

(Continued)

(52) U.S. Cl.
CPC ...... *H01L 29/7787* (2013.01); *H01L 21/0254* (2013.01); *H01L 21/02381* (2013.01); *H01L 21/02458* (2013.01); *H01L 29/201* (2013.01); *H01L 29/205* (2013.01); *H01L 29/404* (2013.01); *H01L 29/4175* (2013.01); *H01L 29/42372* (2013.01); *H01L 29/475* (2013.01); *H01L 29/66462* (2013.01); *H01L 29/7786* (2013.01); *H01L 29/2003* (2013.01)

(58) Field of Classification Search
CPC ........... H01L 29/66462; H01L 29/7787; H01L 29/2003; H01L 29/404; H01L 29/42372; H01L 29/4175

See application file for complete search history.

(56) References Cited

U.S. PATENT DOCUMENTS 8,487,375 B2 * 7/2013 Okamoto .......... H01L 21/76898
257/194
8,643,062 B2 * 2/2014 Parikh et al. ......... H01L 29/778
257/190

(Continued)

OTHER PUBLICATIONS

International Search Report and Written Opinion for PCT/US2014/035504 dated Jan. 22, 2015.

(Continued)

*Primary Examiner* — Marcos D. Pizarro
(74) *Attorney, Agent, or Firm* — Ladas & Parry

(57) ABSTRACT

A method of manufacturing a III-V semiconductor circuit; the method comprising: forming a first layer of a III-V material on a growth substrate; forming a second layer of a III-V material on the first layer of III-V material; forming a FET transistor having a source electrode and a drain electrode in contact with a top surface of the second layer of a III-V material; forming a top dielectric layer above the FET transistor; forming a metal layer above the top dielectric layer, wherein said metal layer is connected to said source electrode; attaching a handle substrate to a top surface of the metal layer; removing the growth substrate from the bottom of the first layer of a III-V material; and forming a bottom dielectric layer on the bottom of the first layer of a III-V material.

9 Claims, 4 Drawing Sheets

(51) Int. Cl.
*H01L 29/201* (2006.01)
*H01L 29/205* (2006.01)
*H01L 29/47* (2006.01)
*H01L 29/20* (2006.01)

(56) References Cited

U.S. PATENT DOCUMENTS

| | | | |
|---|---|---|---|
| 8,872,235 B2* | 10/2014 | Prechtl et al. | H01L 29/66462 257/195 |
| 8,884,335 B2* | 11/2014 | Hirler et al. | H01L 29/0619 257/192 |
| 2011/0140172 A1* | 6/2011 | Chu | H01L 29/4175 257/194 |
| 2011/0169054 A1 | 7/2011 | Wu et al. | |
| 2012/0193677 A1 | 8/2012 | Parikh et al. | |
| 2013/0075790 A1 | 3/2013 | Hirler et al. | |
| 2013/0234207 A1* | 9/2013 | Choi | H01L 29/778 257/194 |
| 2014/0092638 A1* | 4/2014 | Nishimori | H01L 29/41725 363/17 |
| 2014/0306231 A1* | 10/2014 | Ozaki | H01L 23/315 257/76 |

OTHER PUBLICATIONS

H.S. Lee, et al., "Wafer-Level Heterogeneous Integration of GaN HEMTs and Si (100) MOSFETs", Electron Device Letters, IEEE, 33(2), 200-202, (2012).

P.N. Chyurlia, et al., "Monolithic integration of AlGaN/GaN HFET with MOS on silicon<111> substrates", Electronics letters, 46(3), (2010).

R. Dargis, et al., "Epitaxial Si and Gd2O3 Heterostructures: Distributed Bragg Reflectors with Stress Management Function for GaN on Si Light Emitting Devices", ECS Journal of Solid State Science and Technology, 1(5), pp. 246-249, (2012).

Chapter II International Preliminary Report on Patentability (IPRP) from PCT/US2014/035504, dated Jul. 29, 2016.

Extended European Search Report and Opinion for European Patent application No. 14890373.5 dated Nov. 2, 2017.

Office action dated Nov. 21, 2018 with search report from Chinese Patent Application No. 201480077059.9 and its English translation.

* cited by examiner

FET TRANSISTOR ON A III-V MATERIAL STRUCTURE WITH SUBSTRATE TRANSFER

TECHNICAL FIELD

The present disclosure relates to semiconductor structures comprising a Field Effect Transistor using III-V materials, and to methods of manufacturing the same.

BACKGROUND

Semiconductor structures comprising integrated circuits made of III-V materials, in particular Field Effect Transistor (FETs) and in particular High Electron Mobility Transistors (HEMTs) have desirable electronic properties. Because bulk III-V materials can be difficult to manufacture or handle, it is known to grow layers of III-V materials on a growth substrate, and to manufacture the desired semiconductor structures on the grown layers of III-V materials. For example, it is known to grow a GaN layer on a Si growth substrate to avoid having to use a bulk GaN substrate.

However, lattice mismatches between the III-V material and the material of a growth substrate eventually create detrimental defects in the layers of III-V material grown on a growth substrate. For example, there exists a lattice mismatch between GaN and Si. It follows that a GaN layer grown on Si comprises structural defects, the number and size of which increase with the thickness of GaN grown on the Si substrate.

Because it is difficult to grow GaN on Si, for example due to the mobility of the epitaxially deposited atoms on the Si surface, it is known to first deposit a GaN buffer layer at a comparatively low temperature on the Si layer. The "low" temperature allows reducing the atom mobility and thus allow homogeneously covering the Si substrate. A main GaN layer, thereafter used for manufacturing integrated circuits such as GaN HEMTs, is then grown on top of the Gan buffer layer.

FIG. 1 shows a semiconductor structure 10 comprising a main/channel GaN layer 12 grown on top of a GaN buffer layer 14, itself grown on a Si substrate 16. A thin AlGaN barrier layer 18 was deposited on top of the main GaN layer 12.

FIG. 2 shows a GaN HEMT FET 19 formed on the structure 10. A thin gate insulator layer 20 was formed in a portion of the AlGaN barrier layer 18 and a gate electrode layer 22 was formed on top of the gate insulator layer. Source and drain electrode layers 24, 26 were formed though the AlGaN barrier layer 18 in contact with portions of the main/channel GaN layer 12, each on a side of the gate electrode layer 22. A gate field plate layer 28 was formed on top of gate electrode layer 22. A dielectric layer 30 covers HEMT 19. A source pad layer 31 was formed on top of dielectric layer 30 and connected to source electrode layer 24 by a via. A gate pad layer 32 was formed on top of dielectric layer 30 and connected to gate field plate layer 28 by a via. A drain pad layer 33 was formed on top of dielectric layer 30 and connected to drain electrode layer 26 by a via.

To achieve for example a 600V breakdown voltage for a GaN HEMT such as HEMT 19, the thickness of the GaN buffer layer 14 must be of at least 4 µm. However, forming a GaN buffer layer 14 having such a thickness on a Si substrate 16 creates physical defects in the GaN buffer layer 14, which in turn create physical defects in the GaN main/channel layer 12, which detrimentally affect the performance of any integrated circuit formed in the GaN main layer. Thus, forming on a Si substrate a GaN buffer layer 14 having the thickness required to achieve desired electrical properties can lead to poor manufacturing yields and increased manufacturing costs.

Chyurlia, P. N., Semond, F., Lester, T., Bardwell, J. A., Rolfe, S., Tang, H., & Tarr, N. G. (2010), in "Monolithic integration of AlGaN/GaN HFET with MOS on silicon<111> substrates", *Electronics letters*, 46(3), disclose AlGaN/GaN HFETs and silicon MOSFETs integrated monolithically on a silicon (111) substrate. A differential heteroepitaxy technique is used to grow AlGaN/GaN HFET layers on silicon (111) substrates while leaving protected areas of atomically smooth silicon in which MOSFETs are built.

Dargis, R., Clark, A., Arkun, E., Roucka, R., Williams, D., Smith, R., & Lebby, M. (2012), in "Epitaxial Si and Gd2O3 Heterostructures: Distributed Bragg Reflectors with Stress Management Function for GaN on Si Light Emitting Devices", *ECS Journal of Solid State Science and Technology*, 1(5), P 246-P 249 disclose that tensile stress in GaN layers grown directly on Si is a serious obstacle for the implementation of this technology for electronic and photonic devices. They teach that the problem can be solved by stress engineering using epitaxial buffer layers grown on a Si-substrate. Heteroepitaxial Si and $Gd_2O_3$ multilayer structures that can be used both as a tensile strain compensating buffer for GaN epitaxial layers and an efficient reflector for light emitting devices are demonstrated in this work. A three-period distributed Bragg reflector has been fabricated. It exhibits 82% reflectivity at the design wavelength of 450 nm. In situ curvature measurements of the 200 mm diameter wafers with the grown structure reveal compressive stress in the $Gd_2O_3$—Si multilayer structure. The compressive stress compensates the tensile stress which arises during subsequent growth and cooling of the GaN layer.

Lee, H. S., Ryu, K., Sun, M., & Palacios, T. (2012), in "Wafer-Level Heterogeneous Integration of GaN HEMTs and Si (100) MOSFETs", *Electron Device Letters, IEEE*, 33(2), 200-202, disclose a technology for the heterogeneous integration of GaN and Si devices, which is scalable at least up to 4-in wafers and compatible with conventional Si fabrication. The key step in the proposed technology is the fabrication of a Si (100)-GaN—Si hybrid wafer by bonding a silicon (100) on insulator (SOI) wafer to the nitride surface of an AlGaN/GaN on Si (111) wafer. A thin layer of silicon oxide is used to enhance the bonding between the SOI and the AlGaN/GaN wafers. Using this technology, Si pMOS-FETs and GaN high-electron-mobility transistors have been fabricated on a 4-in hybrid wafer. Due to the high-temperature stability of GaN as well as the high-quality semiconductor material resulting from the transfer method, these devices exhibit excellent performance. A hybrid power amplifier has been fabricated as a circuit demonstrator, which shows the potential to integrate GaN and Si devices on the same chip to enable new performance in high-efficiency power amplifiers, mixed signal circuits, and digital electronics.

Published Patent Application US2011-140172 discloses group III-nitride devices that include a stack of III-nitride layers, passivation layers, and conductive contacts. The stack includes a channel layer with a 2DEG channel, a barrier layer and a spacer layer. One passivation layer directly contacts a surface of the spacer layer on a side opposite to the channel layer and is an electrical insulator. The stack of III-nitride layers and the first passivation layer form a structure with a reverse side proximate to the first passivation layer and an obverse side proximate to the barrier layer. Another passivation layer is on the obverse side of the structure. Defected nucleation and stress management layers that form a buffer layer during the formation process can be partially or entirely removed.

There exists a need for a III-V FET that can be manufactured with higher yields and lower manufacturing costs than the known III-V FETs.

SUMMARY

An embodiment of the present disclosure relates to a semiconductor circuit comprising a III-V material structure attached to a handle substrate by a metal layer, wherein the III-V material structure comprises: a first layer of a III-V material, the first layer having a bottom surface and a top surface; a second layer of a III-V material formed on the top surface of the first layer of a III-V material; a first dielectric layer formed on the bottom surface of the first layer of a III-V material; and a FET transistor having a source electrode and a drain electrode in contact with a top surface of the second layer of a III-V material; the FET transistor being covered by a second dielectric layer; and the second dielectric layer being covered by said metal layer; and wherein said metal layer is connected to said source electrode.

According to an embodiment of the present disclosure, the III-V material is GaN.

According to an embodiment of the present disclosure, said metal layer comprises a first sub-layer of metal deposited on top of the second dielectric layer and then planarized, and a second sub-layer of metal deposited on the bottom surface of the handle substrate; the first and second sub-layers of metal being bonded together.

According to an embodiment of the present disclosure, said metal layer is gold.

According to an embodiment of the present disclosure, the drain electrode of the transistor is connected to a via that traverses at least the first and second layers of a III-V material.

According to an embodiment of the present disclosure, the semiconductor circuit comprises a barrier layer formed on the second layer of a III-V material, at least on a region located between the source and drain electrodes of the transistor.

According to an embodiment of the present disclosure, the barrier layer is an AlGaN layer.

According to an embodiment of the present disclosure, the transistor comprises a gate electrode formed above a gate dielectric layer formed above a portion of the barrier layer.

According to an embodiment of the present disclosure, the gate electrode of the transistor is connected to a via that traverses at least the first and second layers of a III-V material.

According to an embodiment of the present disclosure, said metal layer is connected to said source electrode by a via having a contact area with said metal layer larger than a contact area with said source electrode.

According to an embodiment of the present disclosure, said metal layer is connected to said source electrode by a plurality of vias.

An embodiment of the present disclosure relates to a method of manufacturing a III-V semiconductor circuit; the method comprising: forming a first layer of a III-V material on a growth substrate; forming a second layer of a III-V material on the first layer of III-V material; forming a FET transistor having a source electrode and a drain electrode in contact with a top surface of the second layer of a III-V material; forming a top dielectric layer above the FET transistor; forming a metal layer above the top dielectric layer, wherein said metal layer is connected to said source electrode; attaching a handle substrate to a top surface of the metal layer; removing the growth substrate from the bottom of the first layer of a III-V material; and forming a bottom dielectric layer on the bottom of the first layer of a III-V material.

According to an embodiment of the present disclosure, the III-V material is GaN.

According to an embodiment of the present disclosure, the growth substrate is a Si substrate.

According to an embodiment of the present disclosure, the method comprises attaching a handle substrate to a top surface of the metal layer comprises: planarizing the top surface of said metal layer; forming a further metal layer on a bottom surface of the handle substrate; and thermally bonding the planarized top surface of said metal layer to said further metal layer.

According to an embodiment of the present disclosure, said metal layer is gold.

According to an embodiment of the present disclosure, the method comprises connecting the drain electrode of the transistor to a via that traverses at least the first and second layers of a III-V material.

According to an embodiment of the present disclosure, the method comprises forming a barrier layer on a top surface of the second layer of a III-V material, at least on a region located between the source and drain electrodes of the transistor.

According to an embodiment of the present disclosure, the barrier layer is an AlGaN layer.

According to an embodiment of the present disclosure, the method comprises forming a gate dielectric layer above a portion of the barrier layer and forming a gate electrode of the transistor above said gate dielectric layer.

According to an embodiment of the present disclosure, the method comprises connecting the gate electrode of the transistor to a via that traverses at least the first and second layers of a III-V material.

According to an embodiment of the present disclosure, the method comprises connecting said metal layer to said source electrode by a via having a contact area with said metal layer larger than a contact area with said source electrode.

According to an embodiment of the present disclosure, the method comprises connecting said metal layer to said source electrode by a plurality of vias.

According to an embodiment of the present disclosure, removing the growth substrate from the bottom of the first layer of a III-V material comprises: removing mechanically a first portion of the growth substrate; and removing chemically the portion of the growth substrate remaining attached to the bottom of the first layer of III-V material.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as to not obscure the invention.

Figure 1:
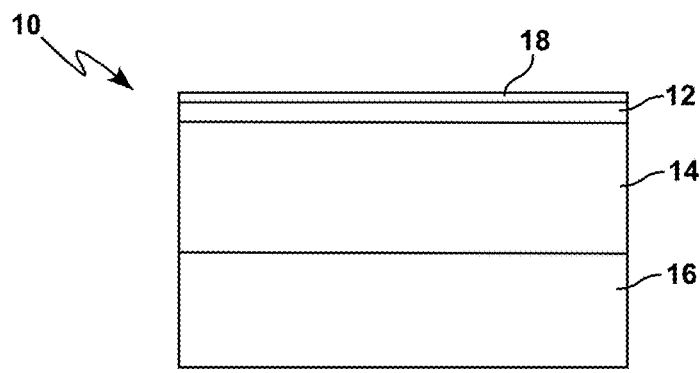
FIG. 1 shows a known III-V semiconductor structure
Figure 3:
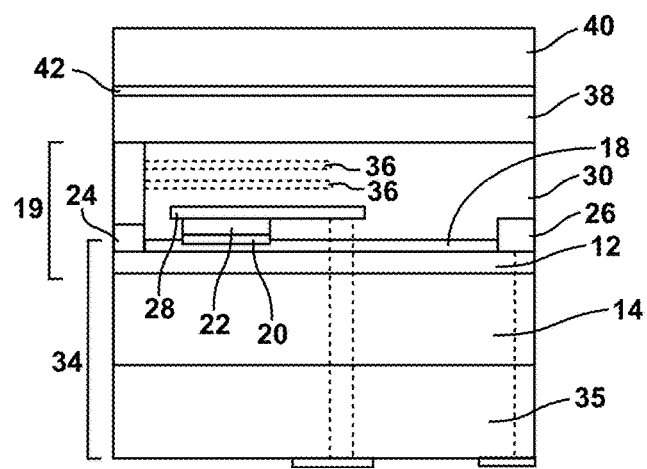
FIG. 3 shows a FET according to an embodiment of the present disclosure.

FIG. 3 shows a GaN HEMT FET 19 formed on a structure 34 according to an embodiment of the present disclosure. In FIG. 3, structure 34 is essentially identical to structure 10 of FIG. 1, except that GaN buffer layer 14 can be thinner than the GaN buffer layer 14 of FIG. 1, as detailed hereafter. According to an embodiment of the present disclosure, structure 34 comprises a dielectric layer 35 where structure 10 comprises growth substrate 16. The HEMT 19 formed on structure 34 can be identical to the HEMT 19 formed on structure 10.

According to an embodiment of the present disclosure, a layer of metal, for example gold, 38 is formed on dielectric layer 30. According to an embodiment of the present disclosure, a handle substrate 40 is attached to the top surface of the layer of metal 38. Optionally, one or more source field plates 36 (two shown, in dashed lines) formed parallel to each other in dielectric 30 can be connected to different heights of the via connecting source electrode 24 to metal layer 38.

According to an embodiment of the present disclosure, the top surface of metal layer 38 is planarized after metal layer 38 is formed on dielectric layer 30, and assembled to a metal layer 42 formed on the bottom surface of handle substrate 40.

According to an embodiment of the present disclosure, handle substrate 40 can be an AlN substrate; for example an AlN wafer. Metal layer 42 can be of the same metal as metal layer 38; for example gold.

According to an embodiment of the present disclosure metal layer 38 and metal layer 42 can be thermally bonded together. The optional planarization of the top surface of metal layer 38 facilitates assembling together metal layer 38 and metal layer 42.

FIGS. 4A-G illustrate the manufacturing of a FET 19 according to embodiments of the present disclosure.

Figure 4A:
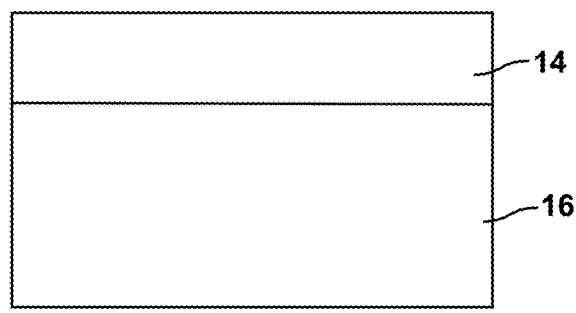
FIGS. 4A-G illustrate the manufacturing of a FET according to embodiments of the present disclosure.

FIG. 4A illustrates the forming of buffer layer 14 on top of growth substrate 16. According to an embodiment of the present disclosure, buffer layer 14 can be a GaN layer and growth substrate 16 can be a Si(111) wafer. Buffer layer 14 can be grown epitaxially on substrate 16 using a MOCVD process. According to an embodiment of the present disclosure, buffer layer 14 can be AlGaN.

Figure 4B:
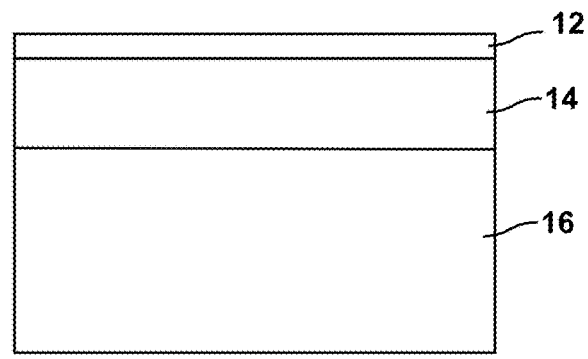

FIG. 4B illustrates the forming of channel layer 12 on top of buffer layer 14. According to an embodiment of the present disclosure, channel layer 12 can be grown epitaxially on buffer layer 14 using a MOCVD process.

Figure 4C:
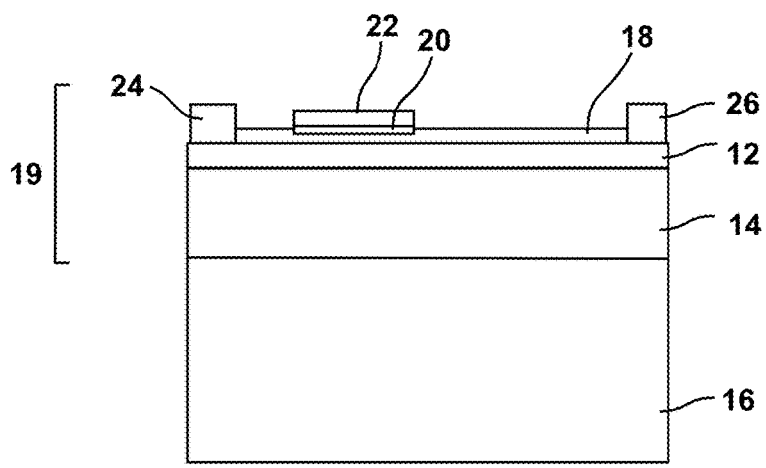

FIG. 4C illustrates the forming of FET 19 on channel layer 12. For example, barrier layer 18 can be grown on top of channel layer 12, before a thin gate insulator layer 20 is formed in a portion of barrier layer 18 above a channel region of FET 19. A gate electrode layer 22 can then be formed on top of gate insulator layer 20. Source and drain electrodes 24 and 26 can be formed in contact with channel layer 12 through barrier layer 18, each on a side of the channel region of the FET. According to an embodiment, barrier layer 18 can be an AlGaN layer.

Figure 4D:
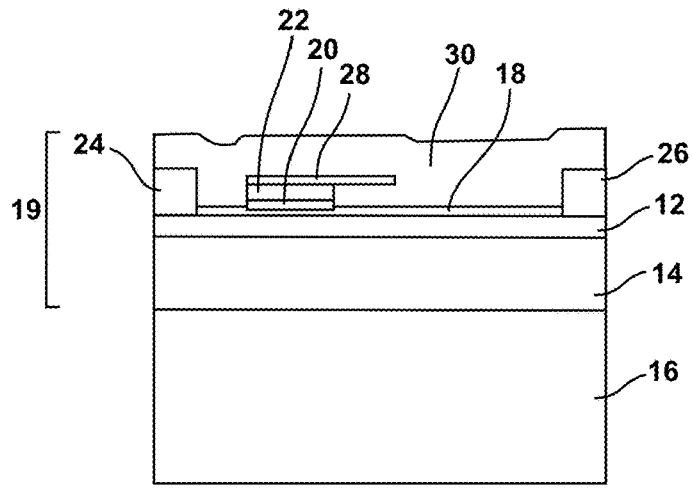
Figure 4E:
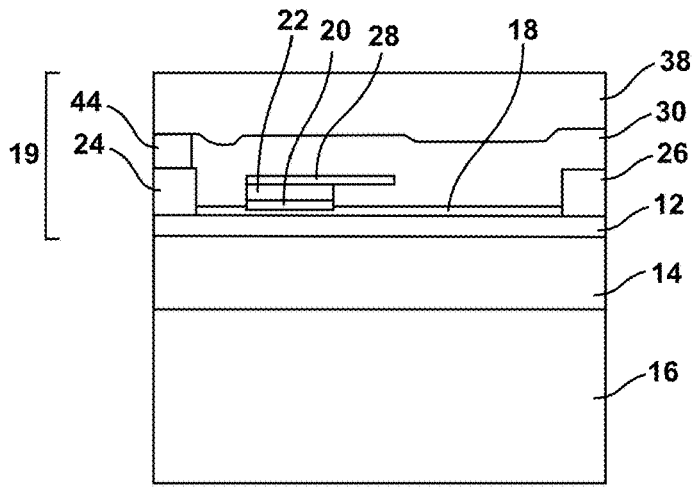

FIG. 4D illustrates a further step of the forming of FET 19, after gate field plate layer 28 was formed on top of gate electrode layer 22 and after dielectric layer 30 was formed over HEMT 19. Dielectric layer 30 can comprise a first sub layer formed prior to gate field plate layer 28 and a second sub layer formed on top of gate field plate layer 28. FIG. 4D shows schematically that the top surface of dielectric layer 30 may conform to the relief of FET 19 and not be flat. According to an embodiment of the present disclosure, FIG. 4E illustrates FET 19 of FIG. 4D after metal layer 38 was formed on top of dielectric layer 30. Metal layer 38 can be a gold layer, or a layer of another electrically conductive material. According to an embodiment of the present disclosure, the top surface of metal layer 38 was planarized. According to an embodiment of the present disclosure, metal layer 38 is connected to source electrode 24, for example by at least one via 44 formed through dielectric layer 30. According to an embodiment of the present disclosure, via 44 is provided for having a large contact surface with source electrode 24 and a large contact surface with metal layer 38. According to an embodiment of the present disclosure, metal layer 38 has a minimum height equal to the maximum height of FET 19. According to an embodiment of the present disclosure, metal layer 38 has a minimum height of 4 μm. According to an embodiment of the present disclosure, metal layer 38 can have a minimum height of 30 μm to facilitate planarizing the top surface of metal layer 38 using chemical mechanical polishing.

According to an embodiment of the present disclosure, the contact surface of via 44 with source electrode 24 is smaller than the contact surface of via 44 with metal layer 38.

Figure 4F:
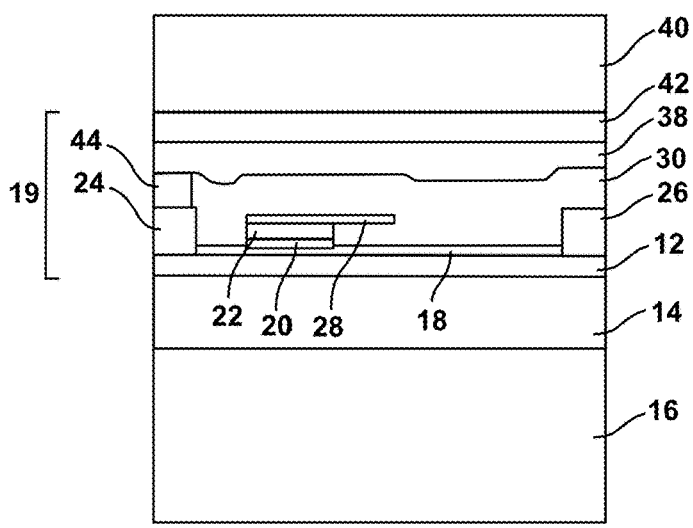

FIG. 4F illustrates FET 19 of FIG. 4E after handle substrate 40 was attached to the top surface of the metal layer 38. According to an embodiment of the present disclosure, metal layer 42 was formed on the bottom surface of handle substrate 40 prior to assembling together metal layers 38 and 42; for example by thermal compression bonding. Other means of bonding can be used, such as epoxy bonding, eutectic bonding, solder bonding.

Figure 4G:
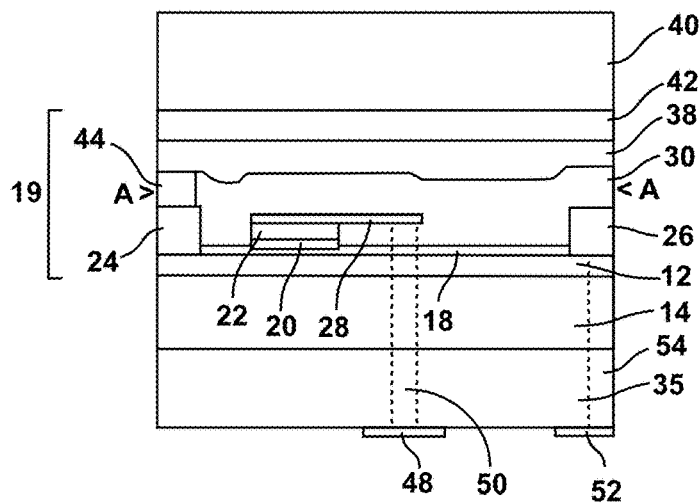

FIG. 4G illustrates FET 19 of FIG. 4F after growth substrate 16 was removed. According to an embodiment of the present disclosure, a bottom portion of the growth substrate 16 can first be removed mechanically, before removing chemically the portion of the growth substrate 16 remaining attached to the bottom of the GaN buffer layer 14.

According to an embodiment of the present disclosure, a dielectric layer 35 is then formed on the bottom of the GaN buffer layer 14. According to an embodiment of the present disclosure, the dielectric material of layer 35 can be Al2O3, AlN, SiN, SiO2, HfO2 or a combination of these materials. According to an embodiment of the present disclosure, gate field plate 28 can be connected to a gate contact pad 48 formed on the bottom surface of dielectric layer 35 using at least one via 50. According to an embodiment of the present disclosure, drain electrode 26 can be connected to a drain contact pad 52 formed on the bottom surface of dielectric layer 35 using at least one via 54.

Figure 5:
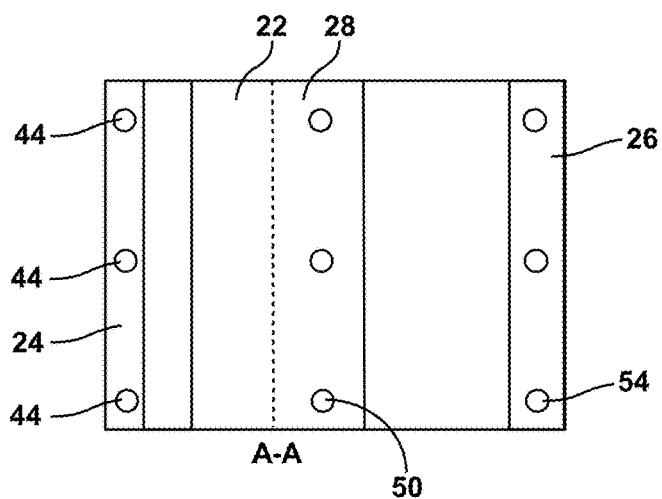
FIG. 5 is a top view of the FET shown in FIG. 4G.

FIG. 5 represents a top view of the FET 19 of FIG. 4G, cut away through dielectric layer 30 along a plane A-A parallel to the surface of the substrates. As shown in FIG. 5, a plurality of vias 44 can be used to connect source electrode 24 to metal layer 38. Via 44 is shown as having a substantially circular cross section but according to an embodiment of the present disclosure via 44 can have an elongated cross section so as to have larger contact surfaces with source electrode 24 and metal plate 38. Optionally, more than one via 50 can be used to connect the gate field plate 28 (or, alternatively, directly the gate electrode 22) to the gate contact pad 48. Optionally, more than one via 54 can be used to connect the drain electrode to the drain contact pad 52.

Figure 2:
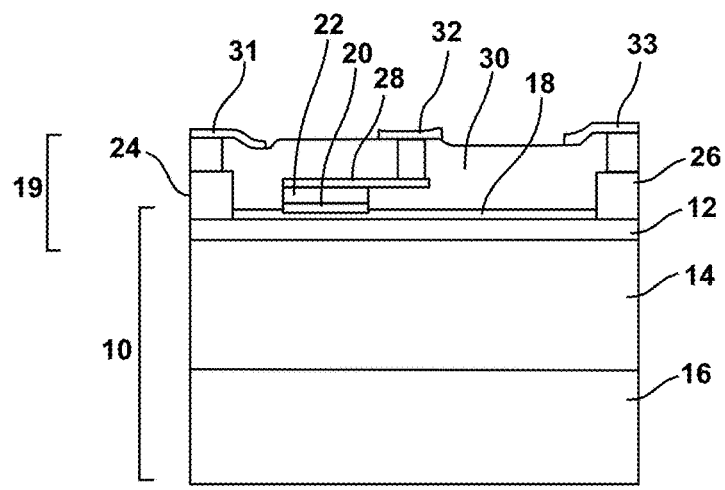
FIG. 2 shows a GaN HEMT FET formed on the semiconductor structure of FIG. 1.

The Inventors have discovered that a FET such as HEMT 19 according to the present disclosure, as illustrated for example in FIG. 4G, has superior electrical properties and in particular a superior breakdown voltage with respect to a FET having the same dimensions and materials but fabricated according to known processes such as illustrated in FIG. 2. Such superior electrical properties are attained by the combined effect of:

lowering the resistivity of the electrical connection to the source of the FET, due to the connection of source electrode 24 to metal plate 38;

increasing the dissipation of the heat accumulating in the source electrode 24; and increasing the breakdown voltage of buffer layer 14.

According to an embodiment of the present disclosure, buffer layer 14 can be of lower thickness than buffer layer 14 according to a known process. In such embodiment, a FET according to the present disclosure attains superior electrical properties such as an increased breakdown voltage due mainly to the lowering the resistivity of the electrical connection to the source of the FET and increasing the dissipation of the heat accumulating in the source electrode, due to the connection of source electrode 24 to metal plate 38. On another hand, because buffer layer 14 has a reduced thickness, channel layer 12 grown on buffer layer 14 has a reduced level of defect due to lattice mismatch compared to a channel layer 12 grown on a buffer layer 14 according to a known process. Thus, FETs according to such embodiment of the present disclosure, with a buffer layer 14 of reduced thickness, have both superior electrical properties and lower level of fabrication defects with respect to FETs of identical dimensions and materials fabricated according to known processes.

For example, the inventors have shown that a FET, such as HEMT 19 as shown in FIG. 4G, can have a higher breakdown voltage than HEMT 19 of FIG. 2, having the same dimensions and materials, with a GaN buffer layer 14 having half the thickness of the GaN buffer layer 14 of FIG. 2.

As detailed above, embodiments of the present disclosure can comprise a first layer 14 of a III-V material such as GaN and a second layer 12 of a III-V material such as GaN, the second layer 12 having been formed on the top surface of the first layer 14. However, the present disclosure is not limited to the III-V material being GaN. Other possible III-V materials include for example GaAs, InP, SiC.

Embodiments of the present invention have been described that comprise two layers 12 and 14 of a III-V material. Growing two layers of a III-V material allows growing top a layer 12 of III-V material having desired properties on a growth substrate by: growing on a growth substrate 16 a first layer 14 of the III-V material having inferior properties, and then growing on said first layer 14 of III-V material the second layer 12 of III-V material having the desired properties. The growing of the first layer 14 of the III-V material having inferior properties can be made at a lower temperature, and the growing of the second layer 12 of III-V material having the desired properties can be made at a higher temperature.

However, embodiments of the present invention also comprise a semiconductor structure having only one layer of a III-V material, if a III-V material layer of desired properties can be grown directly on the growth substrate. Such embodiments would be illustrated by FIGS. 3 and 4B-4G by considering layers 14 and 12 as a single layer of material.

Figure 6:
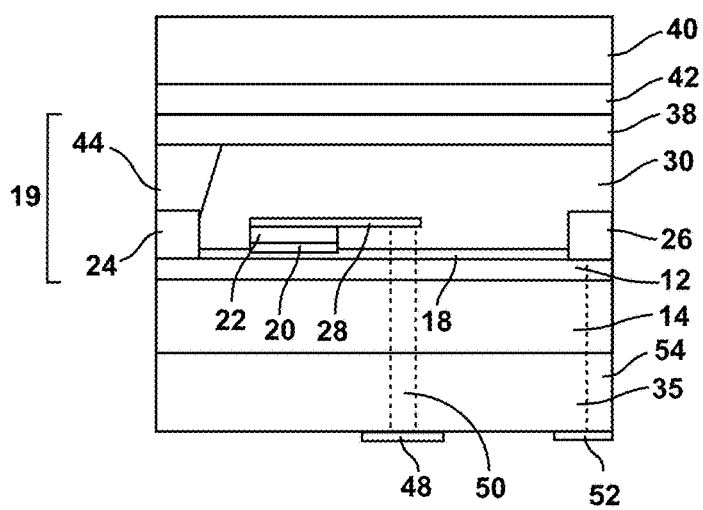
FIG. 6 shows a FET according to an embodiment of the present disclosure.

FIG. 6 illustrates an embodiment of the present disclosure where the at least one via 44 between the source electrode 24 and the metal plate 38 is arranged such that its contact surface with metal plate 38 is larger than its contact surface with source electrode 24. The inventors have noted that such an arrangement allows achieving a more even distribution of the electrical field in metal plate 38 when operating FET 19, thus improving further the electrical properties of FET 19. It is noted that FIG. 6 illustrates a case where the via 44 has walls that follow the trunk of a linear cone however, according to an embodiment of the present disclosure, the via 44 can also have walls that follow the trunk of an exponential cone.

It is noted that FIGS. 3-6 illustrate embodiments of the present disclosure comprising a HEMT FET 19. However, it is noted that embodiments of the present can instead of a HEMT comprise a FET such as described in U.S. Pat. No. 8,530,978, issued on Sep. 10, 2013, which is hereby incorporated by reference.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. A semiconductor circuit comprising a III-V material structure attached to a handle substrate by a metal bonding layer, wherein the III-V material structure comprises:

a first layer of a III-V material, the first layer having a bottom surface and a top surface;

a second layer of a III-V material formed on the top surface of the first layer of a III-V material;

a first dielectric layer formed on the bottom surface of the first layer of a III-V material; and a FET transistor having a source electrode and a drain electrode in contact with a top surface of the second layer of a III-V material; the FET transistor being covered by a second dielectric layer; and the second dielectric layer being covered by said metal bonding layer; and wherein said metal bonding layer is connected to said source electrode; and wherein said metal bonding layer is connected to said source electrode by a plurality of vias.

2. The semiconductor circuit of claim 1, wherein the III-V material is GaN.

3. The semiconductor circuit of claim 1, wherein the drain electrode of the transistor is connected to a via that traverses at least the first and second layers of a III-V material.

4. The semiconductor circuit of claim 1, wherein said metal bonding layer comprises a first sub-layer of metal deposited on top of the second dielectric layer and then planarized, and a second sub-layer of metal deposited on the bottom surface of the handle substrate; the first and second sub-layers of metal being bonded together.

5. The semiconductor circuit of claim 4, wherein said metal bonding layer is gold.

6. The semiconductor circuit of claim 1, comprising a barrier layer formed on the second layer of a III-V material, at least on a region located between the source and drain electrodes of the transistor.

7. The semiconductor circuit of claim 6, wherein the barrier layer is an AlGaN layer.

8. The semiconductor circuit of claim 6, wherein the transistor comprises a gate electrode formed above a gate dielectric layer formed above a portion of the barrier layer.

9. The semiconductor circuit of claim 8, wherein the gate electrode of the transistor is connected to a via that traverses at least the first and second layers of a III-V material.

* * * * *